United States Patent
Sengupta et al.

US 6,235,609 B1
May 22, 2001

(54) METHOD FOR FORMING ISOLATION AREAS WITH IMPROVED ISOLATION OXIDE

(75) Inventors: Samit Sengupta, San Jose; Faran Nouri, Los Altos, both of CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/541,768

(22) Filed: Apr. 3, 2000

(51) Int. Cl.⁷ ........................................... H01L 21/76
(52) U.S. Cl. ................... 438/424; 438/400; 438/450; 437/67; 257/50
(58) Field of Search .................... 438/424, 400, 438/450; 437/67; 257/50

(56) References Cited

U.S. PATENT DOCUMENTS 5,410,176 * 4/1995 Liou et al. ............................. 257/50
5,436,190 * 7/1995 Yang et al. ............................ 437/67
5,981,354 * 11/1999 Spikes et al. ........................ 438/424

* cited by examiner

Primary Examiner—Vu A. Le
Assistant Examiner—Pho Luu
(74) Attorney, Agent, or Firm—Peter Zawilski

(57) ABSTRACT

For use with a sub-micron semiconductor process, a trench isolation process enables the formation of a wider isolation oxide around the shallow trench isolation (STI) opening. The wider oxide width minimizes the recessing of oxide along the trench sidewalls during subsequent cleaning and etching steps. In a method for forming STI regions on a silicon substrate having a buffer oxide thereon and a nitride layer on top of the buffer oxide, a mask layer is defined on the nitride layer patterning isolation regions in unmasked areas of the nitride layer. Isolation regions of sufficient depth are etched through in unmasked areas of the nitride layer, the buffer oxide and into the silicon substrate. Performing a lateral etch (a nitride shaving) of the nitride layer under the mask layer undercuts a portion of the nitride layer under the mask layer. After the lateral etch, the mask layer is removed. The STI region is filled with an oxide layer and is planarized until the oxide layer is substantially flush with the nitride layer. The resulting oxide layer is wider and protects the STI region from subsequent processing.

22 Claims, 3 Drawing Sheets

United States Patent 6,235,609 B1

METHOD FOR FORMING ISOLATION AREAS WITH IMPROVED ISOLATION OXIDE

FIELD OF INVENTION

The present invention is generally directed to the manufacture of a semiconductor device. In particular, the present invention relates to a process that enables the formation of isolation oxide above shallow isolation trench structures.

BACKGROUND OF INVENTION

One important stage in the manufacture of semiconductor devices is the formation of isolation areas to electrically separate the active devices or portions thereof, that are closely integrated in the silicon wafer. The particular structure of a given active device can vary between device types, a MOS-type transistor generally includes source and drain regions and a gate electrode that modulates current flowing in a channel between the source and drain regions. Unintended current should not flow between source and drain regions of adjacent MOS-type transistors. However, during the manufacturing process, movement of dopant atoms, for example, of boron, phosphorus, arsenic, or antimony, can occur within the solid silicon of the wafer. This movement is referred to as diffusion. The diffusion process occurs at elevated temperatures where there is a concentration gradient between dopant atoms external to the silicon wafer and those dopant atoms within the silicon wafer.

It is typically employed when forming p-type and n-type regions of a silicon integrated circuit device.

A technique referred to as "trench isolation" has been used to limit such flow. A particular type of trench isolation is referred to as shallow trench isolation (STI). STI is often used to separate the respective diffusion regions of devices of the same or different polarity type (i.e., p-type versus n-type). The trench regions are formed in the semiconductor substrate by recessing the substrate deep enough for isolation and refilling with insulating material to provide the isolation among active devices or different well regions.

In a conventional process, a significant problem with STI is that isolation oxide is exposed to numerous etch and clean sequences during subsequent processing, leading to recessing of the trench oxide. Excessive trench oxide loss may lead to inverse narrow width effects, excessive topography, and photo-alignment problems, excessive leakage on trench sidewalls and isolation breakdown. Consequently, device quality and reliability may be impaired.

Refer to FIG. 1. A cross-section of an STI structure 100 is built with a prior art process. The shallow trenches 120 in the silicon substrate 110 have received a fill oxide 130. However, subsequent processing of the structure 100 has contributed to oxide recessing 140. Oxide recessing 140 degrades the performance of the transistor active area 150.

Accordingly, a need exists for a shallow trench isolation process that lessens the loss of trench oxide as the process technology approaches fractional microns.

SUMMARY OF INVENTION

The present invention is exemplified in a number of implementations, two of which is summarized below. A modification of a shallow trench isolation process enables the deposition of a wider oxide above the STI opening. The extra oxide width minimizes recessing along the trench sidewalls during subsequent wafer processing. In accordance with an embodiment of the invention a method for forming shallow trench isolation regions on a silicon substrate having a buffer oxide thereon and a nitride layer on top of the buffer oxide, comprises defining a mask layer on the nitride layer patterning isolation regions in unmasked areas of the nitride layer. Next, unmasked areas of the nitride and buffer oxide layers are etched until the silicon substrate is exposed. To form STI regions, further etching into the silicon substrate is done. According to the invention, providing a wider oxide above the STI opening involves performing a shaving of the nitride layer under the mask layer undercutting a portion of the nitride layer. After the nitride shaving, the mask layer is removed. An additional feature of this embodiment is that the shallow trench regions are filled in with a dielectric layer and this dielectric layer is planarized until it is substantially flush with the nitride layer. The dielectric layer may also be silicon oxide. The silicon oxide may be planarized by chemical mechanical polishing.

In accordance with another embodiment of the invention a method for forming shallow trench isolation regions on a silicon substrate having a buffer oxide thereon and a nitride layer on top of the buffer oxide, comprises defining a mask layer on the nitride layer patterning isolation regions in unmasked areas of the nitride layer. Next, unmasked areas of the nitride and buffer oxide layers are etched until the silicon substrate is exposed. To form STI regions of sufficient depth, further etching into the silicon substrate is done. This embodiment of the invention of providing a wider oxide above the STI opening involves performing a shaving of the mask layer over the nitride layer laterally trimming a portion of the mask layer exposing additional area of the nitride layer. After the mask layer shaving, the additional area of the nitride layer is etched until underlying buffer oxide is exposed. Next, the unshaved mask layer is removed. An additional feature of this embodiment is that the shallow trench regions are filled in with a dielectric layer and this dielectric layer is planarized until it is substantially flush with the nitride layer. Also the dielectric layer may be silicon oxide. Chemical mechanical polishing may be used to planarize the silicon oxide.

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
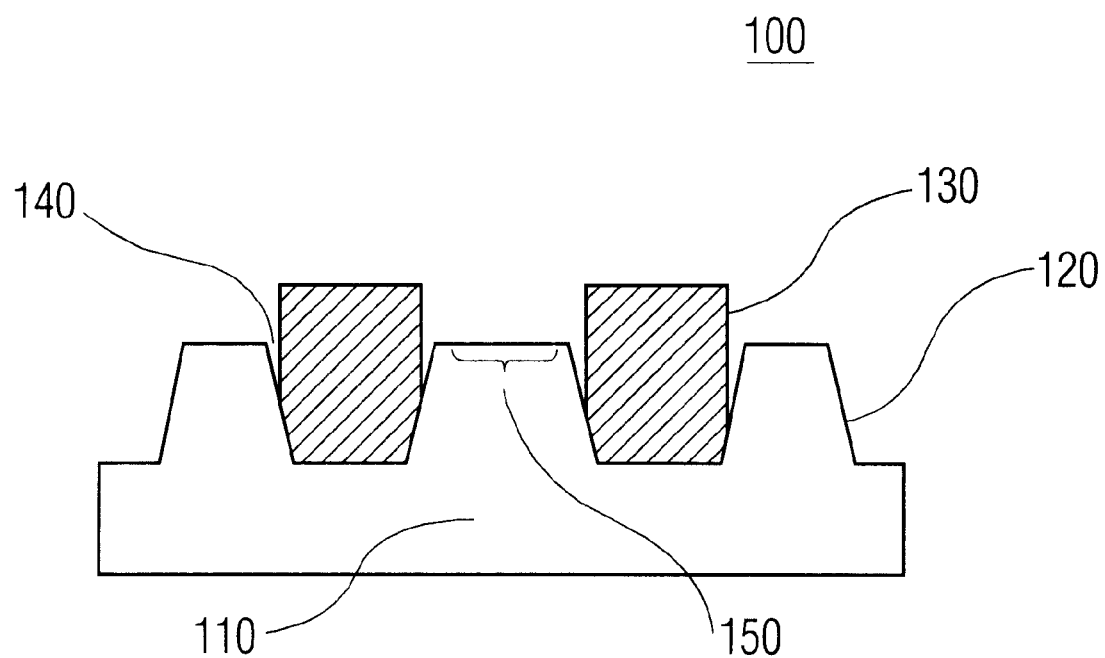
FIG. 1 illustrates according to the prior art, oxide recesses along an STI sidewall.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found to be useful and advantageous in connection with a shallow trench isolation process used in the manufacture of MOS-type transistors. The present invention has been found to be particularly useful to maintain the integrity of the trench fill dielectric, usually an oxide, during subsequent etch and clean sequences of a fabrication process. Typically, the trench isolation process includes forming shallow trenches in the silicon, which ultimately are filled in with oxide or other suitable dielectric. In the discussion that follows, a MOS structure is used to describe an example implementation of the invention. However, the invention is not necessarily limited to MOS.

In an example process, an STI structure is built on a silicon substrate. Upon the silicon substrate, a buffer oxide is formed. Silicon nitride is formed on the buffer oxide. Through photolithography, STI and active junction areas are defined on the silicon nitride. Trench regions are etched through the silicon nitride and buffer oxide and further into the silicon substrate to a depth in the range of about 2000 to 4000 Å. A post-trench etch clean prepares the trench regions for subsequent dielectric fill, usually an oxide. The photo-resist mask may be removed after the post-trench etch clean.

A modification of the process according to the present invention is that prior to removing the photo-resist mask, a timed etch is carried out to laterally etch the nitride beneath the photomask. The amount of nitride removed depends upon the extra oxide width required for a given process. In an optimized process, the raised trench oxide portion is flush with the trench sidewall just prior to poly-silicon deposition in order to maximize the transistor width (W). The additional initial oxide width at the mouth of the trench, minimizes the recessing along the trench sidewall during subsequent process steps.

After the trench oxide fill, the structure is planarized, usually with chemical mechanical polishing (CMP), until the fill oxide is substantially flush with the nitride. The nitride is removed and the structure undergoes further processing to define the active circuit areas.

Refer to FIGS. 2A–2F. An STI process employing an example embodiment according to the present invention is represented in a series of cross-sections of the steps in fabricating the trench isolation. Trench isolation may be formed by a number of methods. For example, the present invention is applicable in a trench isolation method such as that outlined in U.S. Pat. No. 5,882,982, entitled "Trench Isolation Method," issued on Mar. 16, 1999, assigned to VLSI Technology, Inc. and herein incorporated by reference in its entirety.

Figure 2A:
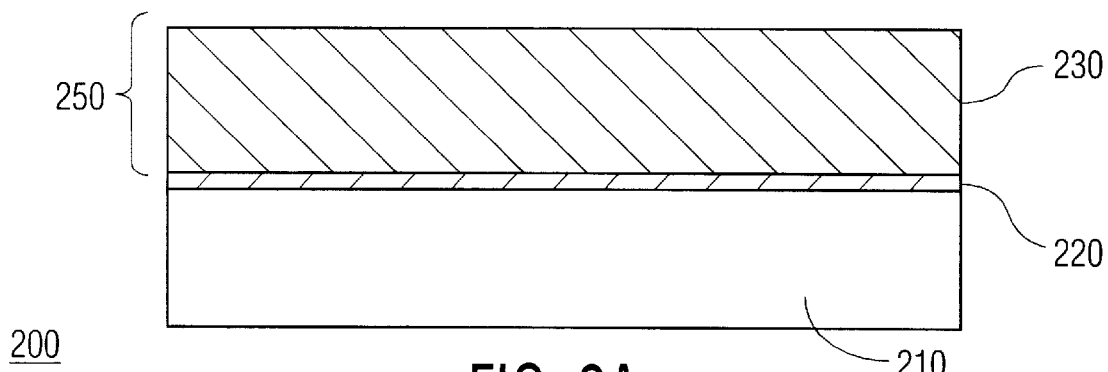
FIG. 2A illustrates a silicon substrate having the buffer oxide and nitride layer thereon in which shallow trench isolation is defined according to an embodiment of the present invention.
Figure 2B:
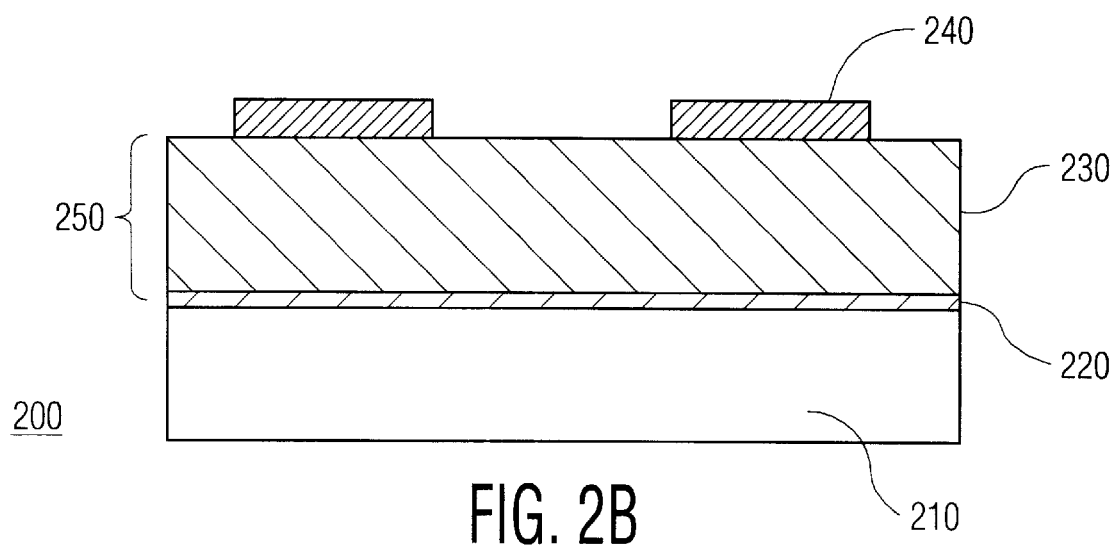
FIG. 2B illustrates the masking of the STI regions of the structure depicted in FIG. 2A.

As shown in FIG. 2A, an STI structure 200 begins with a silicon substrate 210. On the substrate 210 a buffer oxide 220 is formed. The oxide may be thermally grown or created in a chemical vapor deposition (CVD) process. Upon the buffer oxide 220, a nitride layer 230 is formed. A dielectric stack 250 is defined. Though not illustrated, in another example process, an additional dielectric layer may be deposited upon the nitride layer 230 and serve as a hard-mask. Such a dielectric hardmask may be silicon oxynitride or a silicon-rich oxide. The desired STI locations are patterned by a photomask 240, as illustrated in FIG. 2B.

Dielectric films may be formed in a number of ways. For example, the thin oxide 220 may be thermally grown on the substrate by exposing the substrate to an oxidizing ambient ($O_2$, $H_2O$) at elevated temperatures. Thermal oxidation produces $SiO_2$ films with controlled thickness and Si/SiO interface properties. The range of thickness for a thermally grown $SiO_2$ film ranges from about 30 Å to 10,000 Å. Oxide, nitride, oxynitride films, and other dielectric films may be formed by chemical vapor deposition (CVD). Variations on CVD include plasma enhanced chemical vapor deposition (PECVD), atmospheric pressure chemical vapor deposition (APCVD), and low pressure chemical vapor deposition (LPCVD). These CVD methods are conventional. These techniques are well known.

In a range of example processes, the $SiO_2$ thickness may between about 50 Å to 250 Å. The SiN thickness may between about 900 Å and 2700 Å. The $SiO_xN_y$ thickness may between about 200 Å to 900 Å. Having formed the dielectric stack, the trench areas are defined. In that the present invention is applicable to a number of processes with varying critical dimensions (CDs), and that the CDs are approaching smaller sizes, the dielectric stack may be built in a range of layer thickness.

In one example, in a 0.15 μm process as applied to the present invention, the wafer buffer oxide may have a thickness of about 100 Å. The SiN thickness may be about 1800 Å, and if used, the $SiO_xN_y$ hard mask thickness may be about 570 Å.

In another example, a 0.25 μm process, as applied to the present invention, the wafer buffer oxide may have a thickness of about 200 Å. The SiN thickness may be about 1925 Å, and the $SiO_xN_y$ thickness may be about 700 Å. However, for a given process, the thickness of the dielectric stack layers may fall within a number of ranges.

Figure 2C:
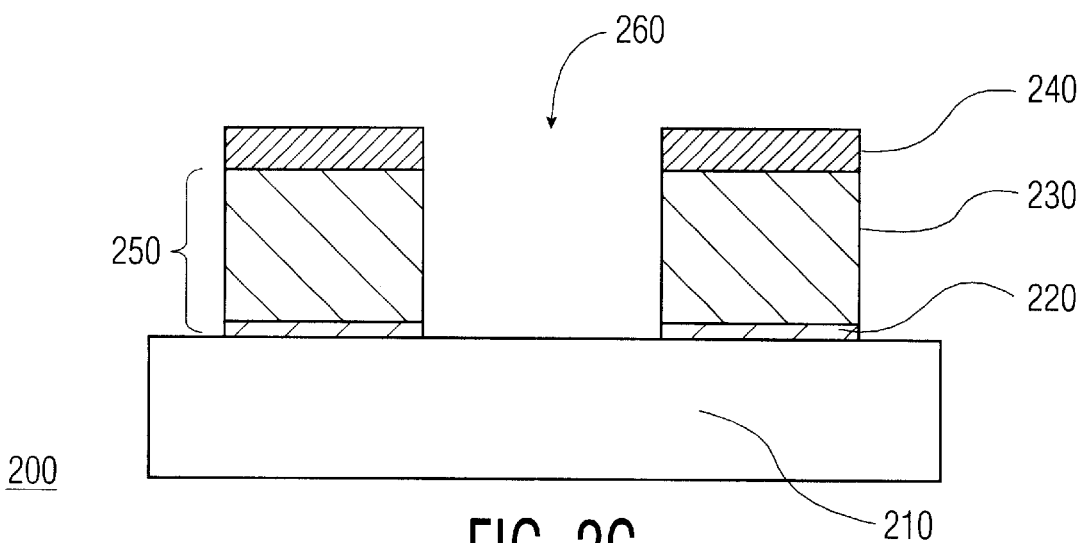
FIG. 2C illustrates the etching of the nitride layer and buffer oxide of FIG. 2B.
Figure 2D:
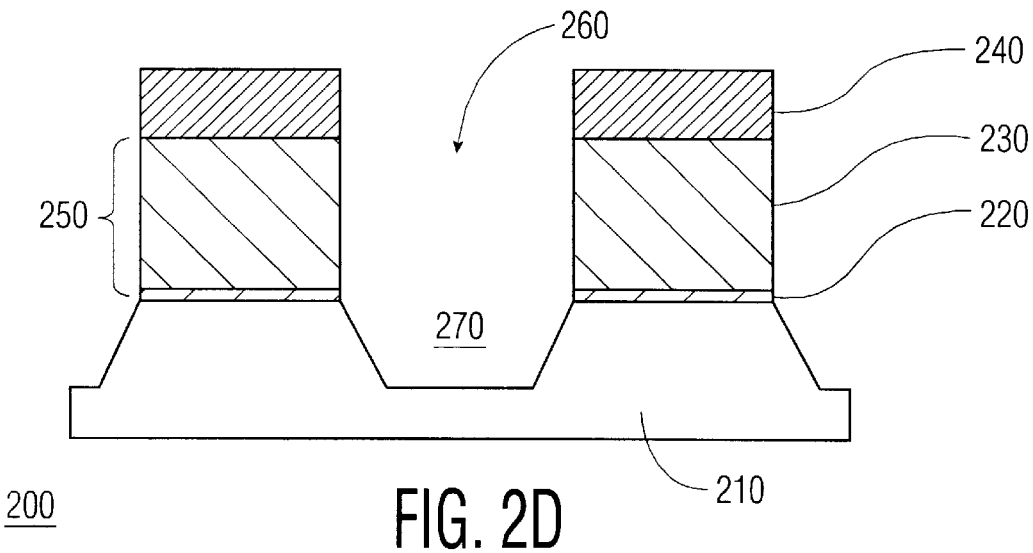
FIG. 2D depicts the shallow trench etched into the silicon substrate of FIG. 2C.

Refer to FIG. 2C. The exposed areas of the substrate 210 are etched. The dielectric stack 250 is etched through the nitride layer 230 and the buffer oxide 220, until the silicon substrate 210 is exposed. The dielectric stack 250 defines the isolation in the open area 260 and the active device areas in the nitride regions 230. The exposed silicon substrate 210 is further etched until a trench region 270, as shown in FIG. 2D is obtained. In a typical process, the trench depth ranges from about 2000 to 4000 Å.

Figure 2E:
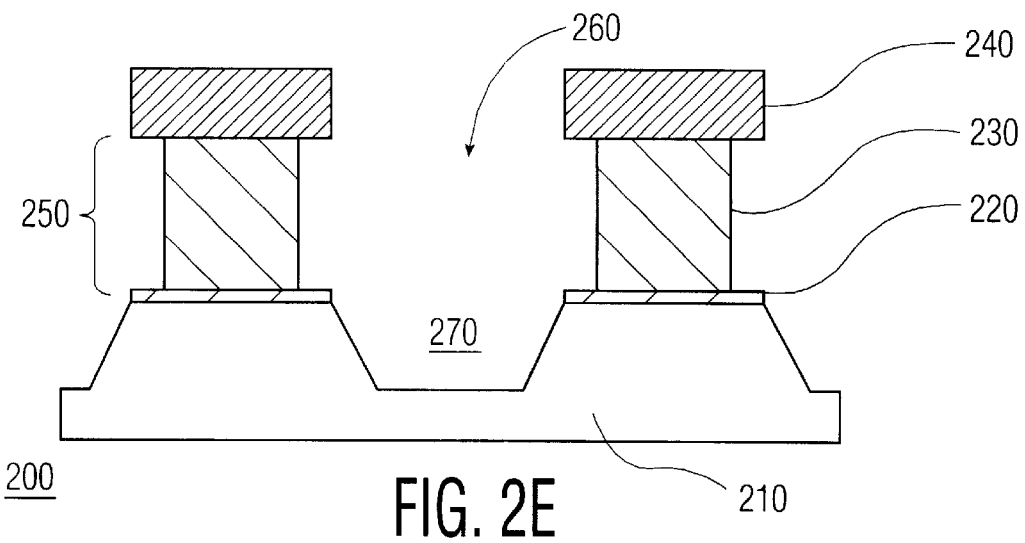
FIG. 2E depicts the undercutting of the masked nitride layer prior to oxide fill of the STI region according to an embodiment of the present invention.

The combination of the steps in the present invention to prevent oxide recessing is applied after the silicon trench region 270 has been defined. As shown in FIG. 2E, the nitride layer 230 beneath the photomask 240 is laterally etched (i.e., "nitride shaving"). About 50Å–750 Å of nitride layer 230 is laterally etched for a 0.15 μm technology. For a 0.25 μm technology, about 100 Å to about 1000 Å of layer 230 may be laterally etched.

In one example process according to the present invention, a timed nitride etch is carried out in dilute hot phosphoric acid. Etch time is controlled to regulate the amount of lateral nitride loss. The wet etch is isotropic. Depending upon the etchant composition and temperature, the etch time ranges from about 5 seconds to about seconds for a 0.15 μm process.

In another example embodiment according to the present invention, the nitride shaving may be carried out in a plasma reactor. A suitable chemistry is chosen to have a sufficiently high etch selectivity ratio of nitride to silicon to prevent changes in the trench dimensions.

Figure 2F:
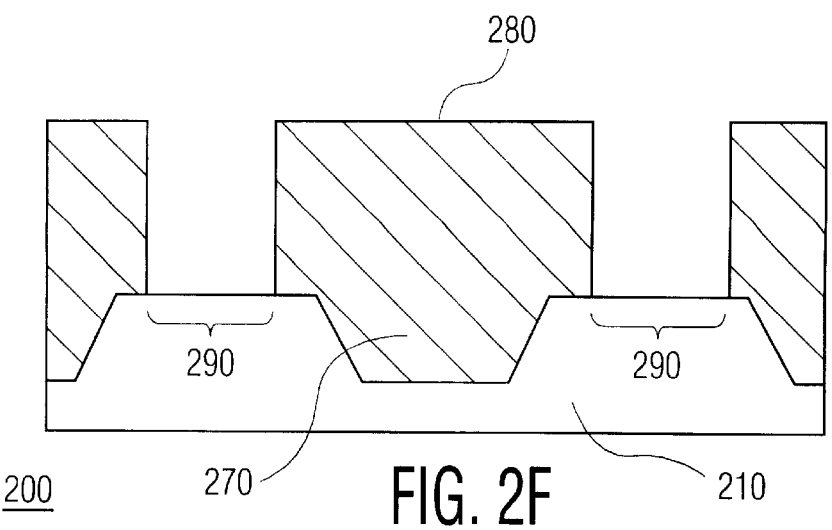
FIG. 2F depicts the structure of FIG. 2E after dielectric fill and planarization.

Refer to FIG. 2F. After the lateral nitride shaving, the photomask 240 is stripped off. The trench 270 in the silicon substrate 210 is filled in with a dielectric 280. Usually the dielectric 280 is a CVD oxide. In some processes, a liner oxide may first be thermally grown in the trench 270 prior to trench fill deposition of a dielectric 280. Through chemical mechanical polishing (CMP), the fill dielectric 280 is planarized flush with the nitride layer 230. After planarizing, the nitride layer 230 is removed, opening an active area 290. Within the active area 290, a transistor is built in subsequent processing and the transistor is isolated from its neighbor by an STI region.

In another embodiment according to the present invention, the nitride shaving of the nitride layer 230, as shown in FIG. 2E, is performed after the stripping of the photomask 240. The nitride shaving may be performed in either a wet etch in phosphoric acid or a dry etch in a plasma. The amount of nitride shaved is controlled for the specific fabrication process. Some etch chemistries may be selective to oxide and not to silicon, in such as case, prior to nitride shaving, a line oxide may be grown in the trench to protect the exposed silicon in the trench prior to nitride etch.

In yet another embodiment, rather undergoing a nitride shaving of FIG. 2E, the photomask 240 may be laterally shaved by the appropriate amount. The corresponding amount of nitride layer 230 may be etched anisotropically. The etch would have a high selectivity ratio of nitride to silicon to minimize the effects of etching on the silicon. Such an etch may be a plasma.

The adjusting of the lateral width of the nitride layer and its effect in defining the resulting coverage of the fill dielectric of the completed STI region helps prevent the formation of oxide recesses along the STI sidewall. Consequently, the quality of the transistor structures is enhanced and the reliability of circuits built from them is increased.

While the present invention has been described with reference to several particular example embodiments, those skilled in the art will recognize that many changes may be made thereto without departing from the spirit and scope of the present invention, which is set forth in the following claims.

What is claimed:

1. A method for forming shallow trench isolation regions on a silicon substrate having a buffer insulating layer thereon and a nitride layer on top of the buffer insulating layer, comprising the steps of:
    defining a mask layer on the nitride layer to pattern isolation regions in unmasked areas of the nitride layer;
    etching the isolation regions through the unmasked areas of the nitride layer and the buffer insulating layer and into the silicon substrate forming shallow trench isolation regions of predetermined depth; and
    shaving the nitride layer under the mask layer to undercut a portion of the nitride layer under the mask layer.

2. The method of claim 1 wherein after the step of shaving of the nitride layer, the method further comprising the steps of:
    removing the mask layer;
    filling in the shallow trench isolation regions with a dielectric layer; and
    planarizing the dielectric layer until substantially flush with the nitride layer.

3. The method of claim 1 wherein the depth of the trench isolation regions range from about 2000 Å to 5000 Å.

4. The method of claim 1 wherein the step of shaving of the nitride is performed with an etch selected from the group including: wet etch, plasma etch.

5. The method of claim 1 wherein the step of planarizing the dielectric layer is performed with chemical mechanical polishing.

6. The method of claim 1 wherein the dielectric layer includes a liner dielectric and a fill dielectric.

7. The method of claim 1,
    wherein the dielectric liner is selected from the group including: silicon dioxide, silicon-rich oxide; and
    wherein the fill dielectric is selected from the group including: silicon dioxide, silicon-rich oxide.

8. The method of claim 1 wherein the shaving of the nitride layer laterally removes about 50 Å to about 1000 Å from each vertical edge defined by the mask layer.

9. The method of claim 1 wherein the shaving of the nitride layer laterally removes about 1% to about 80% of dimensions defined by the mask layer.

10. A method for forming shallow trench isolation regions on a silicon substrate having a buffer insulating layer thereon and a nitride layer on top of the buffer insulating layer, comprising the steps of:
    defining a mask layer on the nitride layer patterning isolation regions in unmasked areas of the nitride layer;
    etching the isolation regions through the unmasked areas of the nitride layer and the buffer insulating layer and into the silicon substrate forming shallow trench isolation regions of predetermined depth;
    shaving the mask layer over the nitride layer laterally trimming a portion of the mask layer exposing additional area of the nitride layer; and
    etching an additional area of the nitride layer corresponding to the trimmed portion of the mask layer.

11. The method of claim 10 wherein after the step of etching the additional area of the nitride layer, the method further comprising the steps of:
    removing the mask layer;
    filling in the shallow trench isolation regions with a dielectric layer; and
    planarizing the dielectric layer until substantially flush with the nitride layer.

12. The method of claim 11 wherein planarizing the dielectric layer is with chemical mechanical polishing.

13. The method of claim 11 wherein the dielectric layer includes a liner dielectric and a fill dielectric.

14. The method of claim 11,
    wherein the dielectric liner is selected from the group including: silicon dioxide, silicon-rich oxide; and
    wherein the fill dielectric is selected from the group including: silicon dioxide, silicon-rich oxide.

15. The method of claim 10 wherein the etching of the additional area of the nitride layer is done with an anisotropic etch selective to silicon, the etch having an etch rate in nitride substantially greater than the etch rate of silicon.

16. The method of claim 10 wherein the shaving of the mask layer is performed in a plasma reactor.

17. The method of claim 10,
    wherein the shaving of the mask layer completely removes the mask layer; and
    wherein the nitride layer is laterally etched in the range about 50 Å to about 1000 Å from each vertical edge defined by the mask layer.

18. The method of claim 10,
    wherein the shaving of the mask layer completely removes the mask layer; and wherein the nitride layer is laterally etched in the range about 1% to about 80% of dimensions defined by the mask layer.

19. The method of claim 10 wherein the depth of the trench isolation regions range from about 2000 Å to about 5000 Å.

20. The method of claim 10 wherein the shaving of the mask layer is with an etch selected from the group including: wet etch, plasma etch.

21. The method of claim 10 wherein the shaving of the mask layer laterally removes about 50 Å to about 100 Å from each vertical edge defined by the mask layer.

22. The method of claim 10 wherein the shaving of the mask layer laterally removes about 1% to about 80% of dimensions defined by the mask layer.

* * * * *